US007986540B2

(12) United States Patent
Heckenbach

(10) Patent No.: US 7,986,540 B2
(45) Date of Patent: Jul. 26, 2011

(54) CONTROLLING SWITCHING NOISE OF AN INDUCTIVELY LOADED THYRISTOR

(75) Inventor: Terry Heckenbach, Cedarburg, WI (US)

(73) Assignee: Johnson Controls Technology Company, Holland, MI (US)

( * ) Notice: Subject to any disclaimer, the term of this patent is extended or adjusted under 35 U.S.C. 154(b) by 659 days.

(21) Appl. No.: 12/044,369

(22) Filed: Mar. 7, 2008

(65) Prior Publication Data

US 2009/0224744 A1 Sep. 10, 2009

(51) Int. Cl.
*H02M 7/155* (2006.01)
*G05F 1/70* (2006.01)

(52) U.S. Cl. .......................... 363/128; 363/44; 323/210

(58) Field of Classification Search .......... 323/209–210, 323/239, 240, 284; 363/45, 46, 85, 128; 327/455, 469

See application file for complete search history.

(56) References Cited

U.S. PATENT DOCUMENTS 3,461,317 A 8/1969 Morgan
3,763,418 A 10/1973 Beck et al.
4,323,835 A 4/1982 Lee
4,459,529 A 7/1984 Johnson
4,706,180 A 11/1987 Wills
5,136,216 A 8/1992 Wills et al.
5,218,283 A 6/1993 Wills et al.
5,276,392 A 1/1994 Beckerman
6,208,113 B1 3/2001 Lelkes et al.
6,323,624 B1 * 11/2001 Henriksen ....................... 322/20
6,411,653 B1 6/2002 Arunachalam et al.
6,864,659 B2 3/2005 Ratz et al.
7,205,786 B2 4/2007 Ahmad
7,282,887 B1 10/2007 Williams

FOREIGN PATENT DOCUMENTS

EP 0157220 10/1985
EP 0157220 A1 10/1985
EP 2099133 A1 9/2009
EP 2101405 A2 9/2009

OTHER PUBLICATIONS

European Search Report and Opinion for Application No. 09002817.6, dated Jul. 6, 2009, 4 pages.
Office Action for U.S. Appl. No. 12/040,172 dated Mar. 26, 2010, 9 pages.
Analog Devices. "5 V Slew-Rate Limited Half- and Full-Duplex RS-485/RS-422 Transceivers" (2004) 16 pages.

(Continued)

*Primary Examiner* — Jessica Han
(74) *Attorney, Agent, or Firm* — Foley & Lardner LLP

(57) ABSTRACT

Systems and/or methods that facilitate controlling a rate of voltage change across an inductively loaded thyristor when switched are presented. Based on a received control signal indicating a thyristor is to be switched, a control component controls the rate of voltage change across a thyristor associated with an inductive load when the thyristor is switched from a first state to another state to facilitate controlling noise emissions during switching based in part on a predefined noise criteria, without using a filter. A capacitor component is connected to the inductive load and thyristor. The control component employs a voltage-controlled current sink comprising a transistor to facilitate discharging voltage from the capacitor component until the capacitor component is discharged to a predefined voltage level, where at or near such point a gate component can send a signal to the thyristor gate to switch the thyristor to the desired state.

20 Claims, 8 Drawing Sheets

OTHER PUBLICATIONS

Control Resources Inc. "Smart Fan AC-VX-Speed Control for AC Fans and Motors" User Manual, 13 pages.
Micro Nova. "ADR 40 Product Information" 1 page.
Power Systems World 2003. "Phase Control Alternatives for Single Phase Motors." 1 page.
Power Systems World 2003. "Phase Control Alternatives for Single Phase Motors Offer Smart, Low Cost, Solutions" 8 pages.
AirCare Automation. "Application Note—1004, Air Care Installation Wiring and Option Setting" 6 pages.
AirCare Automation. "AirCare VariPhase, ACV 1141, ACV 1142, ACV 1143" 2 pages.
Guy, et al. "Improving Performace and Cost in Single-Pase AC Fan Syatems" (Power Electronics Conference 2004, Power Electronics Magazine Jun. 2005) 5 pages.
ALCO Control. "FSP Fan Speed Power Module Technical Data" (Feb. 16, 2006) Emerson Climate Technologies, 8 pages.
CAREL "FCP—Stand-alone Condenser Control" 2 pages.
Control Resources Inc. "SmartFan Nimbus AC Fan and Motor Control" (2007), 8 pages.
Johnson Controls. "P66 Series Electronic Fan Speed Control" Installation Instructions (Oct. 27, 2005), 8 pages.
Johnson Controls. "P66 Series Electronic Fan Speed Control" Product Bulletin (Mar. 23, 2006), 7 pages.
76 Controls. "Refrigeration Fan Speed Controls P215 Pressure Actuated Single Phase Fan Speed Controllers" 3 pages.
FAE. "Mono-pahse Fan Speed Control" 2 pages.
College of Engineering, University of Wisconsin, Wisconsin Electric Machines and Power Consortium, Research Report 91-18, Oct. 1991, "Adjustable AC Capacitor of a Single Phase Induction Motor" IEEE vol. 29 No. 3, May/Jun. 1993, 7 pages.
Varidigm.com, VSM-CA2 product brochure http://www.varidigm.com/pdf/Website%20Update%20of%20VSM-CA2%20Data%20Sheet.pdf last viewed May 28, 2008, 4 pages.
European Application No. 09002817.6 Search Report dated Jul. 6, 2009; 4 pages.
Notice of Allowance for U.S. Appl. No. 12/040,172, dated Sep. 13, 2010, 10 pages.

* cited by examiner

CONTROLLING SWITCHING NOISE OF AN INDUCTIVELY LOADED THYRISTOR

BACKGROUND

The subject innovation relates generally to thyristors and in particular to controlling switching noise associated with an inductively loaded thyristor.

Conventionally, speed of transition from an off state to an on state of a thyristor is not controllable once the device is gated (e.g., switched). Voltage across the thyristor will rapidly change from an open circuit to a conducting voltage. If an inductive load connected to a power line is being switched, a high rate of voltage change (dv/dt) can occur, and can be coupled through the load to the power line, and such high rate of change can cause an undesirable level of noise emissions from the device to the power line. Many jurisdictions regulate and limit magnitude of noise allowed to be manifested by a device to power lines. When noise emissions generated by a device exceeds such limits, implementation of some form of noise mitigation is required.

Conventionally, to mitigate conducted noise associated with thyristors during change of state, a filter is employed between the noise source and the power line, or a filter is connected externally. For instance, a filter can be a choke placed between the load and the thyristor, and a capacitor connected to the load and a switching terminal of the thyristor. At high power levels, additional elements such as for example resistors, capacitors, special transformers (e.g., common mode chokes), may be necessary in order to mitigate noise—however, such filters can increase cost, size, weight, or heat loss of an associated product.

It is desirable to control rate of voltage change (dv/dt) across a thyristor during change of state (e.g., from off state to on state) such that filtering is not required to meet applicable noise emission standards. It is also desirable reduce cost, size, weight, and heat loss of a product employing thyristor(s).

SUMMARY

The following presents a simplified summary of the innovation in order to provide a basic understanding of some aspects described herein. This summary is not an extensive overview of the disclosed subject matter. It is intended to neither identify key or critical elements of the disclosed subject matter nor delineate the scope of the subject innovation. Its sole purpose is to present some concepts of the disclosed subject matter in a simplified form as a prelude to the more detailed description that is presented later.

According to related aspects, a system that facilitates control of rate of voltage change is described herein. The system can include a thyristor that changes from a first state to at least one other state to regulate an inductive load. The system also can include a control component that employs a voltage-controlled current sink to facilitate control of change of the thyristor from the first state to the at least one other state as a function of predefined noise criteria.

Another aspect relates to a method that facilitates controlling rate of voltage change across a thyristor associated with an inductive load. The method can include controlling rate of voltage change when switching an inductively loaded thyristor from a first state to a second state based in part on predefined noise criteria. Further, the method can comprise switching the inductively loaded thyristor from the first state to the second state.

In still another aspect, a system that facilitates controlling rate of voltage change of a thyristor connected to a load is described herein. The system can comprise means for controlling rate of voltage change when switching a thyristor from a first state to another state based in part on a predefined noise criteria, the thyristor is connected to an inductive load. The system can further comprise means for switching the thyristor from the first state to the other state.

The following description and the annexed drawings set forth in detail certain illustrative aspects of the disclosed subject matter. These aspects are indicative, however, of but a few of the various ways in which the principles of the innovation may be employed and the disclosed subject matter is intended to include all such aspects and their equivalents. Other advantages and distinctive features of the disclosed subject matter will become apparent from the following detailed description of the innovation when considered in conjunction with the drawings.

DETAILED DESCRIPTION

Figure 1:
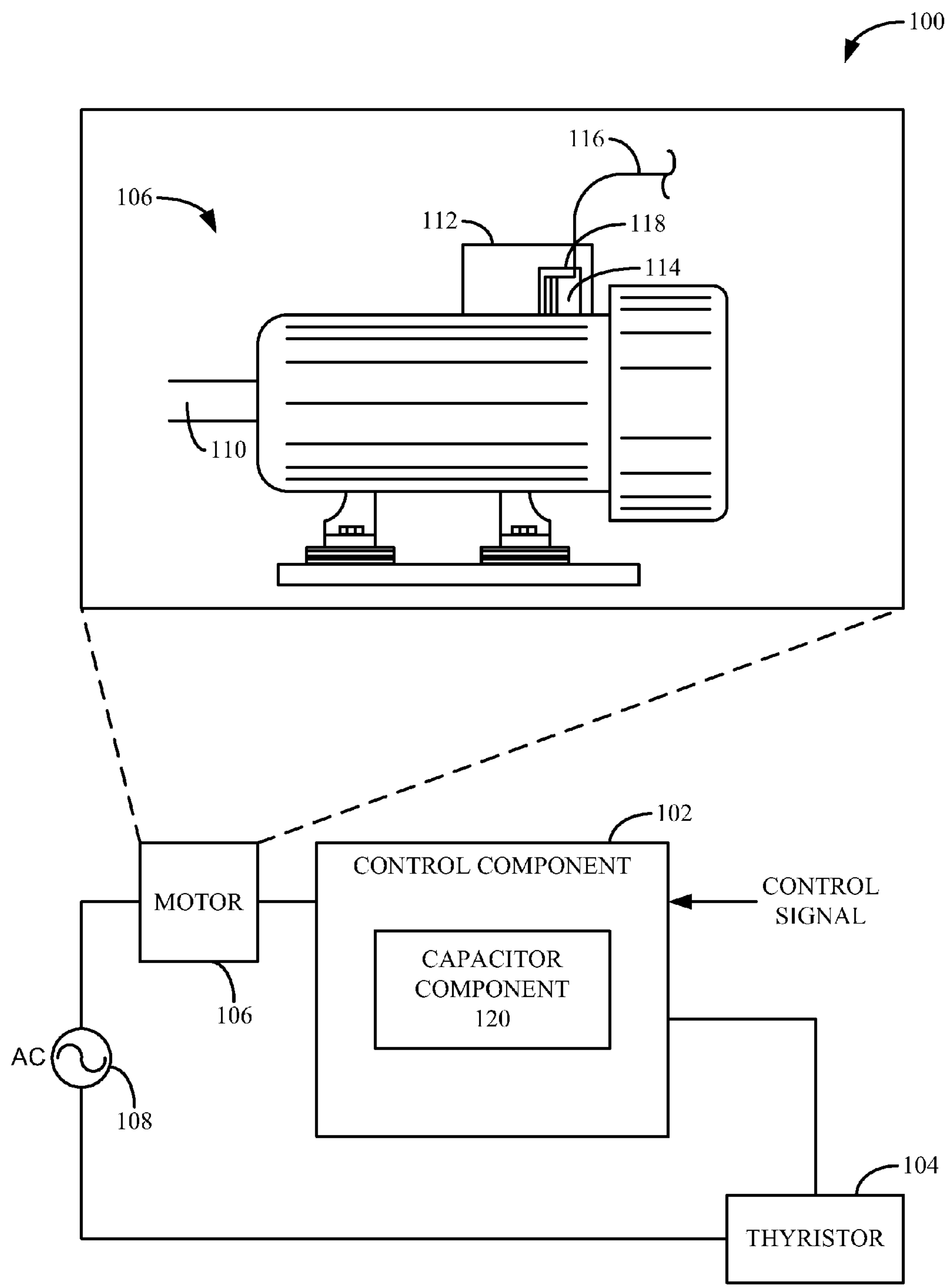
FIG. 1 illustrates a block diagram of a system that can facilitate control of switching noise associated with a transistor in accordance with an aspect of the subject matter disclosed herein.

The disclosed subject matter is described with reference to the drawings, wherein like reference numerals are used to refer to like elements throughout. In the following description, for purposes of explanation, numerous specific details are set forth in order to provide a thorough understanding of the subject innovation. It may be evident, however, that the disclosed subject matter may be practiced without these specific details. In other instances, well-known structures and devices are shown in block diagram form in order to facilitate describing the subject innovation.

Typically, an inductive load, such as an inductive motor, can be connected to an alternating current (AC) power line. A thyristor (e.g., triac) can be connected to the motor to facilitate on-off switching or controlling speed of the motor, for example. If the thyristor is switched from an off state to an on state, voltage across the thyristor will rapidly change from an open circuit to a conducting voltage. This can result in a large rate of voltage change (dv/dt) occurring at the inductive load, which can be transferred through the load to the power line and can manifest itself as an undesirable level of noise at the power line. It is desirable to reduce and/or minimize amount of noise emissions, as for instance, many jurisdictions regulate and limit magnitude of noise allowed to be emitted by a device to power lines.

Conventionally, a filter is employed externally or within the product between the noise source and the power line to mitigate conducted noise associated with a thyristor during change of state of the thyristor (e.g., from an off state to an on state). For instance, a filter can be a choke placed between the load and the thyristor and a capacitor connected to the load and the switching terminal of the thyristor. Further, additional components such as resistors, capacitors, special transformers, may be necessary to mitigate noise emissions at high power levels. The filter and additional components can result in an increase in cost, size, weight, /or heat loss of the product. It is desirable to control rate of voltage change (dv/dt) across a thyristor during change of state of the thyristor such that filtering is not required to meet applicable noise emission standards. It is also desirable to reduce cost, size, weight, and heat loss of a product employing a thyristor(s) to control an inductive load.

Systems, methods, and devices are presented that can facilitate controlling rate of voltage change (dv/dt) associated with an inductively loaded thyristor when switched in order to facilitate reducing noise emissions. For instance, in accordance with various embodiments, the subject innovation can employ a control component that facilitates controlling switching noise associated with a thyristor in part by controlling rate of voltage change (dv/dt) when the thyristor is switched from one state to another state, without employing a filter. A thyristor, such as for example a triac, can be associated with an inductive load (e.g., AC induction motor). A capacitor component (e.g., capacitor or a set of capacitors) can be in parallel with the triac, between the triac and the inductive load. The control component can employ a rectifier component associated with the capacitor component; and the rectifier component can produce a direct current (DC) voltage which can be provided to a current sink component. The current sink component can be controlled using a discharge voltage control component, which can supply a constant or substantially constant voltage to the current sink component to facilitate removing current of a desired magnitude from the capacitor component, which can result in voltage across the capacitor component decreasing linearly, or substantially linearly, over time. After voltage of the capacitor component reaches a desired predefined voltage level (e.g., a voltage level near 0 volts), the triac can be switched (e.g., gated) on without an undesirably large rate of voltage change associated with the load. In another aspect, if for some reason the triac does not switch on (e.g. fails to gate on), the control component can facilitate returning the discharge control voltage to a floor level (e.g., 0 volts) so that the rising load current does not continue to flow through the current sink component.

FIG. 1 illustrates a system 100 that can facilitate control of switching noise associated with a thyristor in accordance with an aspect of the disclosed subject matter. System 100 can include a control component 102 that can facilitate controlling rate of change of a voltage level (dv/dt) associated with an inductively loaded thyristor 104 when the thyristor 104 is changed from a first state (e.g., off state) to another state (e.g., on state). In one aspect, the thyristor 104 can be electrically connected to an inductive load, such as a motor 106, which can be an AC motor (e.g., single-phase motor, three-phase motor, . . . ), for example. In one embodiment, the thyristor 104 can be a triac that can be employed to facilitate regulating a parameter (e.g., speed) associated with the motor 106. The motor 106 can be electrically connected to a power source 108, which can be an AC power source that can provide a desired predetermined AC voltage level (e.g. 120 volts, 240 volts, etc.) at a desired predetermined frequency (e.g., 60 Hz, 50 Hz) to the motor 106 to facilitate operation of the motor 106, where the voltage level and frequency of the power source 108 can depend in part on an associated power grid, for example. For instance, the motor 106 can be an inductive load that can be represented as an inductor in series with a resistor. It is to be appreciated and understood that, while the disclosed subject matter describes an inductive load being a motor 106, the subject innovation is not so limited, and the subject innovation can be applied to virtually any type of inductive load, and it is intended that all such types of inductive loads be included within the scope of the subject innovation.

In accordance with one embodiment, motor 106 can be a single-phase AC induction motor that can include a shaft coupling 110 that can be connected to a device or article (e.g. fan blade) that drives or is driven by the motor 106. The motor 106 can include an enclosure such as a junction box 112 mounted thereon. The junction box 112 can receive conductors 114 that can be connected to a power source via conduit 116. The conductors 114 can be connected within the junction box 112 to power supply mounts 118 of the motor 106. One of the functions of the junction box 112 is to protect the connections at the power supply mounts 118 of the motor 106. The junction box 112 can be suitably weatherproofed to protect the components of the motor 106 from environmental conditions (e.g., dust, moisture, combustible gases, heat, etc.) that can be experienced by the motor 106. For example, the junction box 112 can include thermal insulation to protect the components of the motor 106 from heat generated by the motor 106.

Typically, an inductive load, such as an AC induction motor, can be connected to a power source (e.g., AC power line). If a thyristor is connected to the inductive load (e.g. to control motor speed) and the thyristor is switched from the off state to the on state, the voltage across the thyristor can rapidly change from the open circuit voltage to the conducting voltage, which can cause a large rate of change (dv/dt) to occur at the inductive load. A large rate of change (dv/dt) at the load can manifest itself as an undesirably large amount of noise at the power source. As such noise emissions can negatively impact the power system associated with the power source, it is desirable to minimize these noise emissions. Further, jurisdictions have regulated noise emissions to limit the amount of noise emissions generated by devices associated with power lines (e.g., power source), and it is desirable to be able to control the noise emissions associated with an inductive load so that the noise emissions are within applicable noise emission limits.

Conventionally, a filter, such as an inductor-capacitor (LC) filter, is employed to mitigate noise associated with an inductively loaded thyristor during a change of state of the thyristor (e.g. from an off state to an on state). The filter and associated components can result in an increase in the cost, size, weight, and/or heat loss of the device containing the thyristor. It is desirable to control rate of voltage change across a thyristor associated with an inductive load when switching the thyristor such that filtering is not required to meet applicable noise emission standards (e.g., predefined noise criteria).

Controlling such rate of voltage change, and thereby controlling noise emissions associated therewith, without employing a filter can facilitate reducing the cost, size, weight, and heat loss of a device containing the inductive load and associated thyristor. The subject innovation can facilitate controlling rate of voltage change across an inductively loaded thyristor when switching the thyristor so that the predefined noise criteria can be met, without using a filter.

Referring again to the control component 102, in one aspect, the control component 102 can include a capacitor component 120 that can be associated (e.g., electrically connected) with the inductive load (e.g., motor 106) and the switching terminal (not shown) of the thyristor 104, where the capacitor component 120 can be positioned in parallel with the thyristor 104 in the circuit. The capacitor component 120 can have a predefined capacitance value, and the capacitor component 120 can be utilized, for instance, when the thyristor 104 is to be switched from one state to another state.

In accordance with an aspect, the control component 102 can receive a control signal that can indicate that the thyristor 104 is to change from a first state (e.g., off state) to another state (e.g., on state). To facilitate controlling the rate of voltage change across the thyristor 104 during the switching of the thyristor 104 from the first state to another state, prior to switching on the thyristor 104, the control component 102 can employ a current sink to remove a predetermined magnitude of current from the capacitor component 120 and discharge voltage from the capacitor component 120 over time based in part on a predetermined discharge control voltage supplied to the current sink. The voltage can be discharged from the capacitor component 120, as desired. For example, the predetermined discharge control voltage can be a constant or substantially constant discharge control voltage so that voltage can be discharged linearly or substantially linearly from the capacitor component 120. As another example, the predetermined discharge control voltage supplied to the current sink can be controlled (e.g., shaped) to facilitate discharging voltage from the capacitor component 120 such that the noise signature is optimized, as desired. In accordance with another aspect, the control component 102 can facilitate rectifying an AC signal associated with the capacitor component 120 to generate a DC voltage that can be utilized by the control component 102 to facilitate removing the predetermined magnitude of current and discharging the voltage from the capacitor component 120.

After the voltage level of the capacitor component 120 is at a desired predefined voltage level (e.g., a voltage level that is close to 0 volts), the control component 102 can facilitate switching (e.g., gating) the thyristor 104 (e.g., triac) on without an undesirably large rate of voltage change across the thyristor 104, as the reduction of voltage across the capacitor component 120 prior to switching on the thyristor 104 can facilitate reducing and/or minimizing the step change (e.g., dv/dt) in the voltage across the thyristor 104, so that the amount of switching noise can meet the predefined noise criteria. In one aspect, the predefined noise criteria can relate to, for example, an amount of noise that a load can emit to a power line in a power grid (e.g., power source 108), a type of product associated with the load, a type of function (e.g., speed regulation) being performed with respect to the load (e.g., motor 106), etc. For example, the predefined noise criteria can specify that the amount of noise that can be emitted by a device to a power line associated with a power source 108 (e.g. AC power source) is to be at or below a predefined level of noise.

In accordance with another aspect, if the thyristor 104 is not switched on (e.g., the thyristor 104 fails to gate on), the control component 102 can facilitate controlling the current sink that removes the predetermined magnitude of current from the capacitor component 120 to turn off the current sink and to prevent the rising load current from continuing to flow through the current sink. For instance, the discharge control voltage can be removed or discontinued to facilitate turning off the current sink. Thus, the control component 102 can facilitate controlling rate of voltage change (dv/dt) across an inductive load connected to a power line when the thyristor 104 is being switched and can thereby control (e.g., reduce and/or minimize) noise emissions associated with switching the inductively loaded thyristor 104 without using a filter, such as an LC filter, to control the amount of switching noise.

The subject innovation, by employing the control component 102, can facilitate reducing and/or minimizing the amount of noise emissions associated with switching a thyristor 104, associated with an inductive load (e.g., motor 106), from an off state to an on state, for example, when the load is associated with a power line (e.g., AC power system), without using a filter. As a result, the subject innovation can facilitate reducing the cost, size, weight, and heat loss of a device employing the load and control component 102. For instance, as a filter (e.g. LC filter) does not have to be used to control noise emissions, there can be a substantial reduction in the size of a circuit board and the weight of the device, because no inductor is necessary, and, typically, an inductor in an LC filter can be large in size and weight and can thus utilize a significant amount of space on a circuit board and can add significant weight to the device. Further, the cost of such a filter can be less cost effective than the control component 102. Moreover, the heat loss associated with such a filter can be significantly greater than the heat loss associated with the control component 102.

Figure 2:
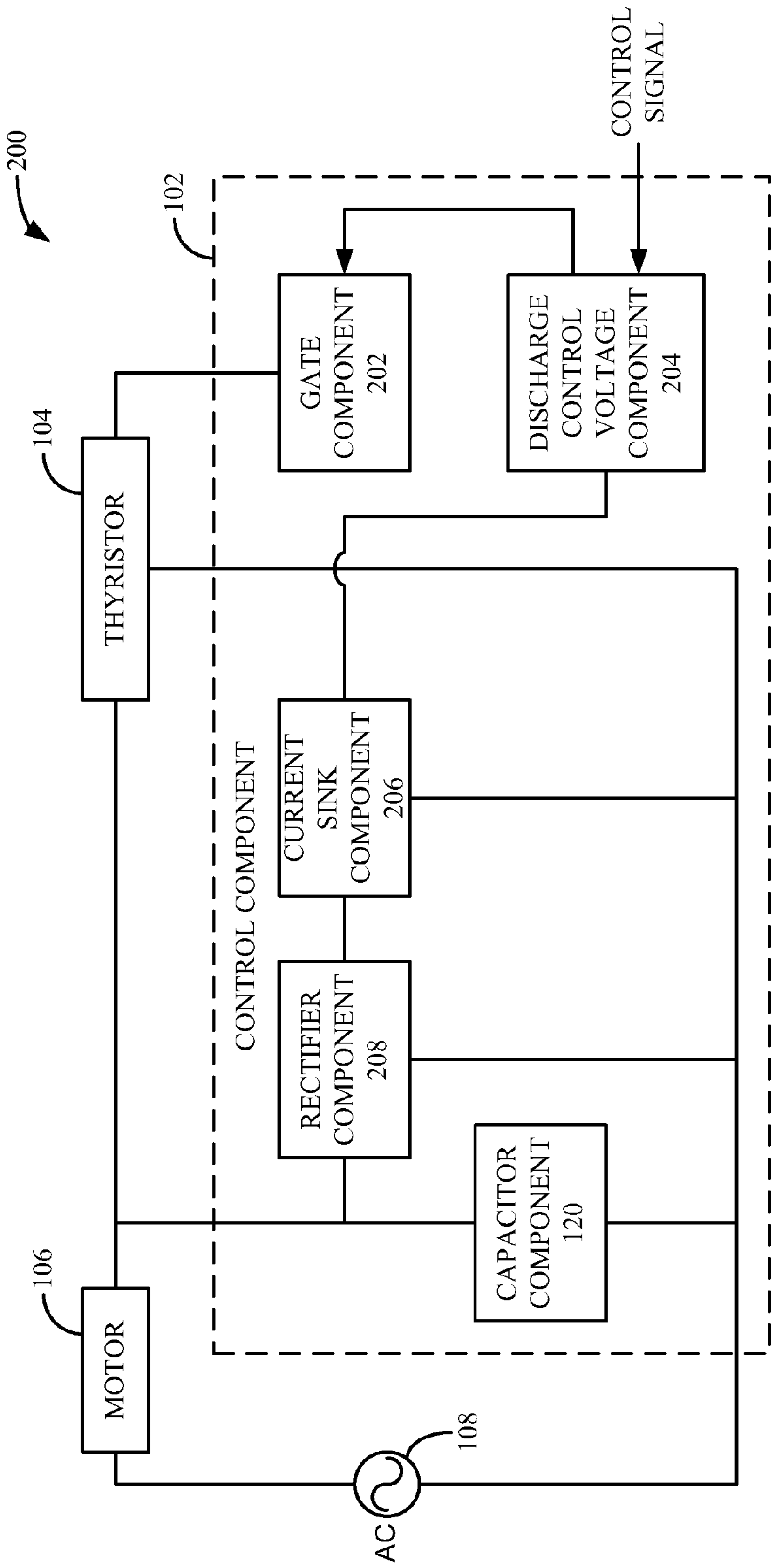
FIG. 2 depicts an example of a block diagram of a system that can facilitate control of switching noise associated with an inductively loaded thyristor in accordance with an aspect of the disclosed subject matter.

Turning to FIG. 2, depicted is a block diagram of a system 200 that can facilitate control of switching noise associated with an inductively loaded thyristor in accordance with an aspect of the disclosed subject matter. System 200 can comprise a control component 102 that can facilitate controlling rate of voltage change across a thyristor 104 associated with an inductive load (e.g., motor 106) when the thyristor 104 is switched from one state (e.g., off state) to another state (e.g. on state), without employing a noise filter, such as an LC filter. The control component 102 can be connected to a thyristor 104 and can facilitate controlling the rate of voltage change associated with a transition of the thyristor 104 (e.g., triac) from one state to another state. The control component 102 also can be connected to an inductive load, such as motor 106. For example, in one embodiment, the thyristor 104 can be a phase-gated triac that can be employed to facilitate controlling the speed of the motor 106 and/or turning the motor 106 on or off. The motor 106 can be connected to a power source 108, which can be an AC power source that can provide a predetermined AC voltage level, which can be virtually any desired AC voltage level (e.g., 120 volts, 240 volts, etc.), at a predetermined frequency (e.g., 60 Hz, 50 Hz). The control component 102 can include a capacitor component 120 that can be electrically connected to the switching terminal of the thyristor 104 and the motor 106. It is to be appreciated that the control component 102, thyristor 104, motor 106, power source 108, and capacitor component 120 each respectively can be the same or similar as, and/or can contain the same or similar functionality as, respective components, such as more fully described herein, for example, with regard to system 100.

In accordance with an aspect, a control signal can be employed to facilitate turning on (e.g., switching on) the thyristor 104, where the thyristor 104 can be switched on based in part on a predefined noise criteria. The control component 102 can include a gate component 202 and discharge control voltage component 204 that can facilitate switching on/off of the thyristor 104 and/or controlling the rate of voltage change across the thyristor 104. The control signal can be provided to the control component 102, where the control signal can be provided to the discharge control voltage component 204 that can provide and/or generate a discharge control voltage based in part on the received control signal. In accordance with one embodiment, the discharge control voltage component 204 can comprise an optotriac that can receive the control signal and can facilitate generating and/or providing a predetermined voltage based in part on the received control signal. The gate component 202, which can be electrically connected to the gate of the thyristor 104 (e.g., triac), will not trigger to switch on the thyristor 104 unless the gate component 202 has been enabled by the discharge control voltage component 204 based in part on predefined noise criteria. For example, when, or at a desired time after, the voltage level of the capacitor component 120 has been discharged to a predefined voltage level (e.g., near 0 volts, such as 4 volts or less), the discharge control voltage component 204 can send a signal to the gate component 202 to enable the gate component 202 to trigger in order to switch on the thyristor 104.

In accordance with another embodiment, the control signal also can be provided to the gate component 202 that can be electrically connected to the gate of the thyristor 104 (e.g., triac) to facilitate switching on the thyristor 104 based in part on a predefined noise criteria. The gate component 202 can monitor the voltage level across the gate component 202 and will not trigger to switch on the thyristor 104 unless the gate component 202 has less than a predetermined voltage level across it. The gate component 202 can trigger to facilitate switching on the thyristor 104 when the rate of voltage change that can occur when switching on the thyristor 104 is below a predetermined threshold level based in part on the predefined noise criteria. In one embodiment, the gate component 202 can be an optotriac (e.g. optically coupled triac) incorporating zero crossing detection that will not trigger unless it has less than a predetermined voltage level (e.g., 20 volts) across it.

In yet another aspect, the discharge control voltage component 204 can be electrically connected to a current sink component 206 and can provide the discharge control voltage to the current sink component 206. The current sink component 206 can be electrically connected to the output of a rectifier component 208, where the current sink component 206 and rectifier component 208 can facilitate discharging voltage and removing current of a desired magnitude from the capacitor component 120. In accordance with an aspect, the input of the rectifier component 208 can be electrically connected with the capacitor component 120 to facilitate removing current and discharging voltage from the capacitor component 120. When the thyristor 104 is being transitioned from one state to another state, the rectifier component 208 can receive an AC signal associated with the capacitor component 120 and can facilitate generating a DC voltage as an output, which can be provided to the current sink component 206. In accordance with one embodiment, the rectifier component 208 can be a diode bridge rectifier with its input associated with the capacitor component 120 and its output connected to the current sink component 206. In accordance with an embodiment, the current sink component 206 can comprise a transistor that can receive the DC voltage from the rectifier component 208 at its emitter and at its gate can receive a predetermined discharge control voltage (e.g., constant or substantially constant voltage; or a desired "shaped" discharge control voltage) from the discharge control voltage component 204. The DC voltage output by the rectifier component 208 can facilitate enabling the current sink component 206 to remove current of a specified magnitude from the capacitor component 120 prior to and/or during the state transition of the thyristor 104. For example, as desired, the current sink component 206 can facilitate discharging the voltage from the capacitor component 120 at a controlled rate so that the voltage is discharged linearly or substantially linearly based in part on a constant or substantially constant discharge control voltage received from the discharge control voltage component 204. The voltage of the capacitor component 120 can continue to be discharged to a predefined voltage level (e.g. voltage level near 0 volts) by the current sink component 206.

In one embodiment, during this period, the gate component 202 can be monitoring the voltage coming across it, and when the voltage across the gate component 202 (e.g., which can correspond with the voltage associated with the thyristor 104) is below the predetermined threshold level, which can occur when the voltage of the capacitor component 120 has been discharged to the predefined voltage level, the gate component 202 can conduct a signal to the gate of the thyristor 104, which can switch on the thyristor 104. In another embodiment, the discharge control voltage component 204 can enable the gate component 202 so the gate component 202 can switch on the thyristor 104 based in part on the predefined noise criteria. After the thyristor 104 is switched on, the thyristor 104 can continue discharging voltage from the capacitor component 120 to continue and/or finish discharging the capacitor component 120. The current associated with the motor 106 can begin to rise and the thyristor 104 can continue to conduct the current through the motor 106 for the remainder of the half-cycle. In one aspect, if for some reason the thyristor 104 fails to switch on, the discharge control voltage component 204 can turn off so that the discharge control voltage can be near 0 volts at the current sink component 206 to facilitate preventing the rising load current from continuing to flow through the current sink component 206.

Figure 3:
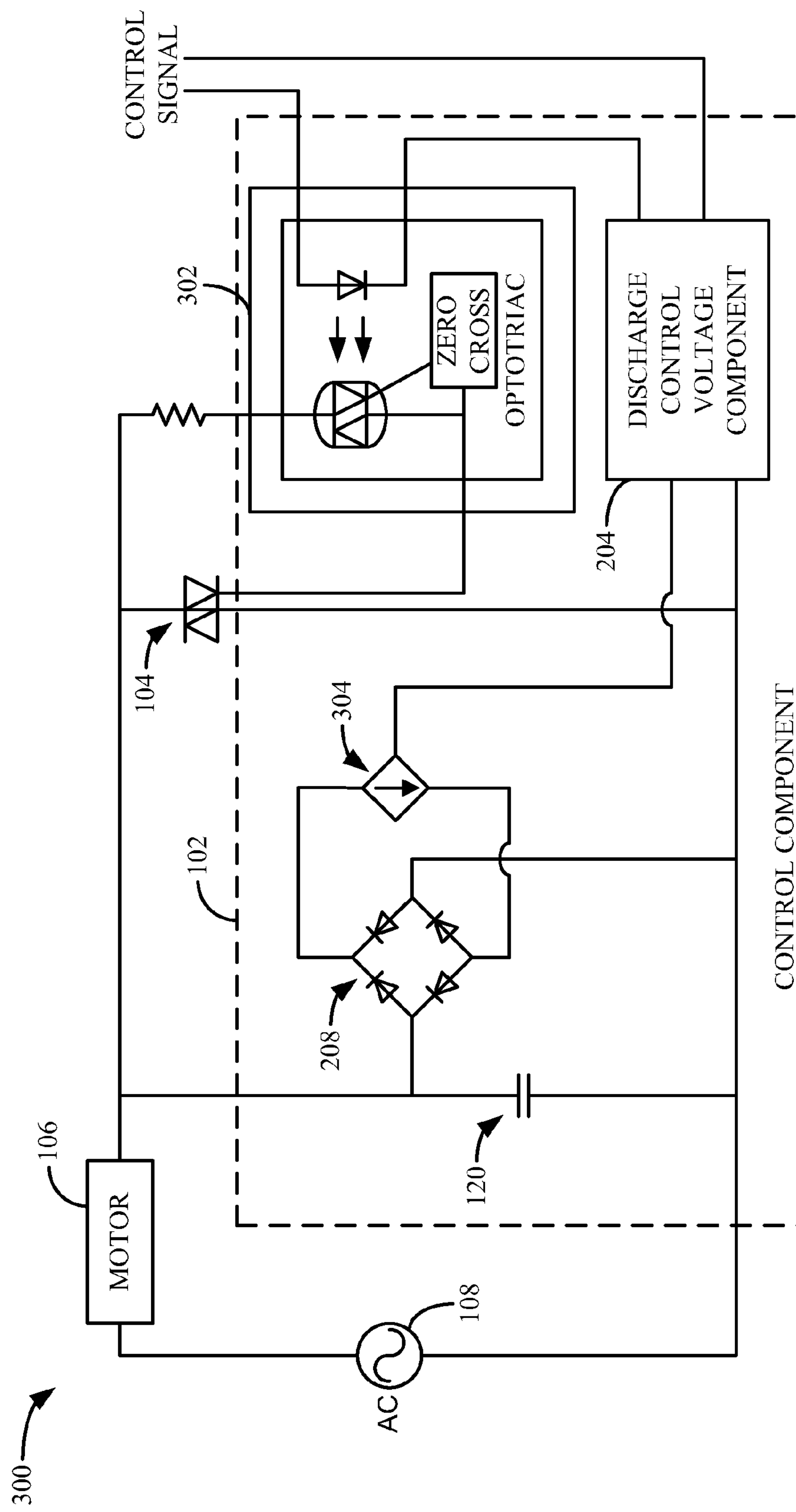
FIG. 3 is a block diagram depicting a system that can facilitate controlling rate of voltage change across a thyristor associated with an inductive load in accordance with an embodiment of the subject matter disclosed herein.

Turning to FIG. 3, depicted is a diagram of a system 300 that can facilitate controlling rate of voltage change across a thyristor associated with an inductive load in accordance with an embodiment of the disclosed subject matter. System 300 can comprise a control component 102 that can facilitate controlling rate of voltage change across a thyristor 104 connected to an inductive load (e.g., motor 106) when the thyristor 104 is switched from one state (e.g., off state) to another state (e.g., on state), without employing a noise filter (e.g. LC filter). The control component 102 can be electrically connected to the thyristor 104 and can facilitate controlling the rate of voltage change associated with a transition of the thyristor 104 (e.g., triac) from one state to another state when associated with an inductive load. The control component 102 also can be electrically connected to an inductive load, such as motor 106. The motor 106 can be electrically connected to a power source 108, which can be an AC power source that can provide a predetermined AC voltage level, which can be virtually any desired AC voltage level (e.g., 120 volts, 240 volts, etc.), at a predetermined frequency (e.g. 60 Hz, 50 Hz). In one aspect, the control component 102 can include a capacitor component 120 that can be electrically connected to the motor 106 and the switching terminal of the thyristor 104, and can be positioned in parallel with the thyristor 104 in the circuit. It is to be appreciated and understood that the control component 102, the thyristor 104, the motor 106, the power source 108, and the capacitor component 120 each can be the same or similar, and/or can contain the same or similar functionality, as respective components, as more fully described herein, for example, with regard to system 100 and/or system 200.

In accordance with an aspect, a control signal can be employed to facilitate switching on the thyristor 104 (e.g. a phase-gated triac), where the thyristor 104 can be switched from a first state (e.g., off state) to another state (e.g., on state), based in part on a predefined noise criteria, to facilitate switching the motor 106 on or off and/or controlling speed of the motor 106. The control signal can be provided to the control component 102, wherein the control signal can be provided to a gate component 302 that can be electrically connected to the gate of the thyristor 104 to facilitate switching on the thyristor 104 based in part on a predefined noise criteria. In one embodiment, the gate component 302 can be a optotriac incorporating zero crossing detection that, after receiving the control signal, will not trigger to switch on the thyristor 104 unless it has less than a predetermined threshold voltage level (e.g., 20 volts) across it. The gate component 302 can trigger to conduct a signal to switch on the thyristor 104 when the rate of voltage change that can occur when switching on the thyristor 104 is below a predetermined threshold level (e.g., predetermined dv/dt) based in part on the predefined noise criteria.

In another aspect, the control signal also can be provided to a discharge control voltage component 204 that can facilitate generating and/or providing (e.g., supplying) a predetermined discharge control voltage based in part on the received control signal. In accordance with an embodiment, the discharge control voltage component 204 can comprise an optotriac that can receive the control signal and can facilitate generating and/or providing the predetermined discharge control voltage based in part on the received control signal.

In yet another aspect, the discharge control voltage component 204 can be electrically connected to a current sink component 304, which can be a voltage-controlled current sink, that can be associated with the capacitor component 120 and can facilitate removing current and discharging voltage from the capacitor component 120 prior to the switching on of the thyristor 104 to facilitate controlling the rate of voltage change across the thyristor 104 during switching of the thyristor 104 in order to control (e.g., limit) the amount of noise emitted during such switching.

The current sink component 304 can be electrically connected to a rectifier component 208, where the current sink component 304 and rectifier component 208 can facilitate discharging voltage and removing current of a desired magnitude from the capacitor component 120 based in part on the discharge control voltage level. In accordance with an aspect, the input of the rectifier component 208 can be electrically connected with the capacitor component 120 to facilitate removing current and discharging voltage from the capacitor component 120. When the thyristor 104 is being transitioned from one state to another state (e.g., being switched from off state to on state), the rectifier component 208 can receive an AC signal associated with the capacitor component 120 and can facilitate generating a DC voltage as an output, which can be provided to the current sink component 304. In accordance with one embodiment, the rectifier component 208 can be a diode bridge rectifier with its input associated with the capacitor component 120 and its output connected to the current sink component 304, which can enable the current sink component 304 to be a unidirectional current sink. In accordance with an embodiment, the current sink component 304 can be a voltage-controlled current sink that can comprise a transistor that can receive the DC voltage from the rectifier component 208 and at its gate can receive the predetermined discharge control voltage from the discharge control voltage component 204. The DC voltage output by the rectifier component 208 can facilitate enabling the current sink component 304 to remove current of a specified magnitude from the capacitor component 120 during the state transition of the thyristor 104, where the current magnitude can be based in part on the predetermined discharge control voltage level received by the current sink component 304 from the discharge control voltage component 204. For example, as desired, the predetermined discharge control voltage component 204 can provide a constant or substantially constant discharge control voltage to the current sink component 304, which can facilitate discharging voltage from the capacitor component 120 at a controlled rate so that the voltage is discharged linearly or substantially linearly based in part on the constant or substantially constant discharge control voltage. The voltage of the capacitor component 120 can continue to be discharged by the current sink component 304 until the voltage at the capacitor component is at a desired predefined voltage level, which can be a voltage level near 0 volts (e.g. 4 volts or less).

During this period of time, the gate component 302 can be monitoring the voltage coming across it, and when the voltage across the gate component 302 is below the predetermined threshold level, which can occur when the voltage of the capacitor component 120 has been discharged to the predefined voltage level, the gate component 302 can conduct to send a signal to the thyristor 104 to switch on the thyristor 104. As the voltage has been discharged from the capacitor component 120 to the predefined voltage level, the thyristor 104 can be switched on without a undesirably large rate of voltage change at the load, and thus, the noise emission associated with the load (e.g., motor 106) during the switching of the thyristor 104 can be low, as desired, to meet the predefined noise criteria. When switched on, the thyristor 104 can continue discharging voltage from the capacitor component 120 to finish discharging the capacitor component 120. During this period, the current associated with the motor 106 can begin to rise and the thyristor 104 can continue to conduct the current through the motor 106 during the remainder of the half-cycle. In one aspect, if for some reason the thyristor 104 fails to turn on, the discharge control voltage component 204 can turn off so that the discharge control voltage can be near 0 volts and load current does not continue to flow through the current sink component 304.

Figure 4:
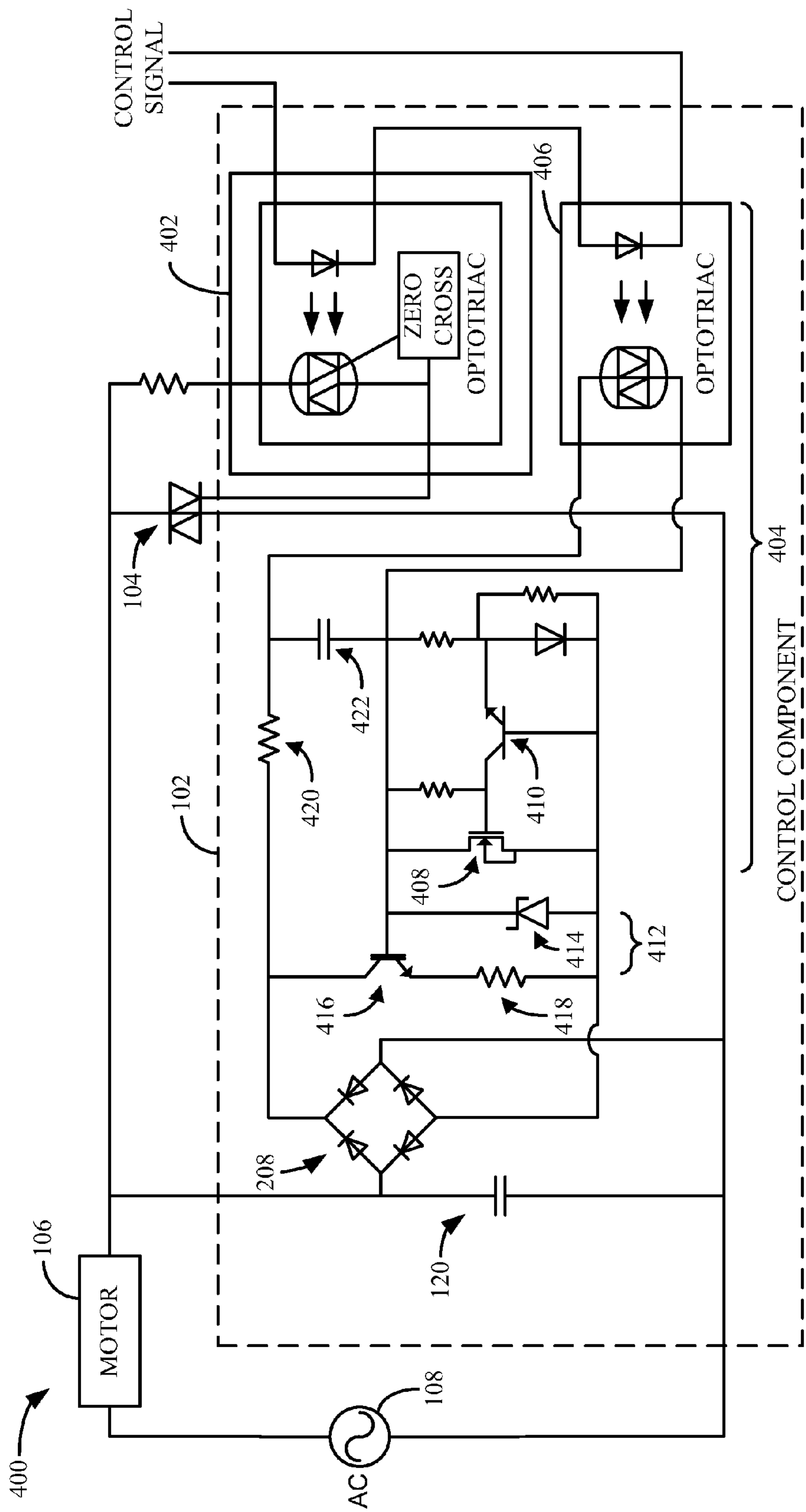
FIG. 4 illustrates a block diagram of another system that can facilitate controlling rate of voltage change across a thyristor associated with an inductive load in accordance with another embodiment of the disclosed subject matter.

Referring to FIG. 4, illustrated is a block diagram of a system 400 that can facilitate controlling rate of voltage change across a thyristor associated with an inductive load in accordance with another embodiment of the disclosed subject matter. System 400 can comprise a control component 102 that can facilitate controlling rate of change of voltage (dv/dt) across a thyristor 104 (e.g. phase gated triac) associated with an inductive load (e.g., motor 106) when the thyristor 104 is switched from one state (e.g., off state) to another state (e.g., on state), without employing a noise filter. In one aspect, the control component 102 can be electrically connected to the thyristor 104 and can facilitate controlling rate of change of voltage associated with a transition of the thyristor 104 (e.g., triac) from one state to another state when associated with the inductive load. The control component 102 can be electrically connected to an inductive load, such as motor 106, which can be an AC induction motor, for example. For instance, in accordance with one embodiment, the thyristor 104 can be a phase-gated triac that can be employed to facilitate controlling speed of the motor 106 and/or turning the motor 106 on or off. The motor 106 can be connected to a power source 108, which can be an AC power source that can provide a predetermined AC voltage level, which can be virtually any desired AC voltage level (e.g., 120 volts, 240 volts, etc.), at a predetermined frequency (e.g., 60 Hz, 50 Hz). In accordance with one aspect, the control component 102 can include a capacitor component 120 that can be electrically connected to the motor 106 and the switching terminal of the thyristor 104, and can be in parallel with the thyristor 104 in the circuit. It is to be appreciated and understood that the control component 102, the thyristor 104, the motor 106, the power source 108, and the capacitor component 120 each can be the same or similar, and/or can contain the same or similar functionality, as respective components, as more fully described herein, for example, with regard to system 100, system 200, and/or system 300.

In accordance with an aspect, a control signal can be employed to facilitate switching on the thyristor 104, based in part on a predefined noise criteria. The control signal can be provided to the control component 102, where the control signal can be provided to a gate component 402 that can be within the control component 102 and can be connected to the gate of the thyristor 104 to facilitate switching on the thyristor 104 based in part on a predefined noise criteria. In one embodiment, the gate component 402 can be an optotriac incorporating zero-crossing detection that does not trigger to send a signal to the gate of the thyristor 104 to turn on the thyristor 104 unless such optotriac has less than a predefined threshold voltage level (e.g., 20 volts) across it. The gate component 402 can trigger to facilitate switching on the thyristor 104 when the rate of voltage change that can occur when switching on the thyristor 104 is below a predetermined threshold level based in part on the predefined noise criteria.

In another aspect, the control signal also can be provided to a discharge control voltage component 404 that can facilitate generating and/or providing a predetermined discharge control voltage, which can be a constant or substantially constant discharge control voltage, based in part on the received control signal. In accordance with an embodiment, the discharge control voltage component 404 can comprise an optotriac 406 that can receive the control signal and be turned on based in part on the received control signal. When triggered by the control signal, the optotriac 406 can facilitate generating and/or providing the desired predetermined constant or substantially constant discharge control voltage. The discharge control component 404 also can include a transistor 408 and transistor 410 where transistor 410 can be electrically connected to the gate of transistor 408 to facilitate controlling whether transistor 408 is turned on or off in order to facilitate controlling whether the current sink component 412 is engaged (e.g., turned on) to remove current from the capacitor component 120, where the current sink component 412 can be engaged when the transistor 408 is turned off, for example. In accordance with one embodiment, the current sink component 412 can comprise diode 414, transistor 416, and resistor 418, where the optotriac 406 can conduct sufficient current to diode 414 to create the constant or substantially constant discharge control voltage at the current sink component 412 when transistor 408 is turned off. Transistor 410 can facilitate turning off transistor 408 when the current through the base emitter junction of transistor 410 exceeds a predetermined current threshold level. Such predetermined current threshold level can be exceeded after the voltage level at the junction of resistor 420 and capacitor 422 decreases to a desired voltage level, which can occur quickly, due to the optotriac 406 being turned on after receiving the control signal. No current will flow through transistor 416 unless the optotriac 406 is turned on.

In another aspect, the current sink component 412, which can be a voltage-controlled current sink, can be associated with the capacitor component 120 and can facilitate removing current and discharging voltage from the capacitor component 120 prior to switching on the thyristor 104 to facilitate controlling the rate of voltage change across the thyristor 104 during switching of the thyristor 104 from a first state (e.g., off state) to another state (e.g., on state). The discharge control component 404 can provide the constant or substantially constant discharge control voltage to the current sink component 412. In accordance with an aspect, the current sink component 412 can be electrically connected to the output of a rectifier component 208, where the current sink component 412 and rectifier component 208 can facilitate discharging voltage (e.g., linearly or substantially linearly) and removing current of a desired magnitude from the capacitor component 120 as a function of the predetermined discharge control voltage (e.g. constant or substantially constant discharge control voltage). In accordance with an aspect, the input of the rectifier component 208 can be electrically connected with the capacitor component 120 to facilitate removing current and discharging voltage from the capacitor component 120. When the thyristor 104 is going to be transitioned from one state to another state (e.g., switched from off state to on state), the rectifier component 208 can receive an AC signal and can facilitate generating a DC voltage as an output. In accordance with one embodiment, the rectifier component 208 can be a diode bridge rectifier with its input associated with the capacitor component 120 and its output connected to transistor 416 in the current sink component 412. The transistor 416 can receive the DC voltage from the rectifier component 208, and transistor 416 can receive the predetermined discharge control voltage (e.g. which can be a desired voltage that is above the gate threshold of transistor 416) at its gate from the discharge control voltage component 404 when transistor 408 is turned off. The DC voltage output by the rectifier component 208 can facilitate enabling the transistor 416 to remove current of a specified magnitude from the capacitor component 120 prior to switching (e.g., gating) on the thyristor 104, where the current magnitude can be based in part on the voltage level (e.g., discharge control voltage) received by the current sink component 412 from the optotriac 406 in the discharge control voltage component 404. The transistor 416 also can facilitate discharging the voltage from the capacitor component 120 at a controlled rate so that the voltage is discharged linearly or substantially linearly based in part on the constant or substantially constant discharge control voltage received from the discharge control voltage component 404. The voltage of the capacitor component 120 can continue to be discharged by the current sink component 412 until the voltage at the capacitor component is at a predefined voltage level, which can be a voltage level that is close to 0 volts.

During this period, the gate component 402, comprising the zero-crossing type optotriac, can be monitoring the voltage coming across it, and when the voltage across the gate component 402 is below the predetermined threshold voltage level (e.g., 20 volts), which can occur when the voltage of the capacitor component 120 has been discharged to the predefined voltage level, the gate component 402 can conduct to send a signal to the gate of the thyristor 104 to switch on thyristor 104. As the voltage has been discharged from the capacitor component 120 to the predefined voltage level, the thyristor 104 can be switched on without a undesirably large rate of voltage change (e.g., dv/dt) in load voltage, and thus, the noise emission associated with the load can be low, as desired, in order to meet the predefined noise criteria. When turned on, the thyristor 104 can continue discharging voltage from the capacitor component 120 to continue and/or finish discharging voltage from the capacitor component 120. During this period, the current associated with the motor 106 can begin to rise and the thyristor 104 can continue to conduct the current through the motor 106 during the remainder of the half-cycle. In one aspect, if for some reason the thyristor 104 fails to switch on, the discharge control voltage component 404 can turn off so that the discharge control voltage can be adjusted to less than the gate threshold of transistor 416 and load current does not continue to flow through the current sink component 412. To facilitate turning off the discharge control voltage component 404 in order to return the discharge control voltage to less than the gate threshold of transistor 416 if the thyristor 104 fails to switch on, in the discharge control voltage component 404, the transistor 408 can be turned on as transistor 410 turns off, where transistor 410 can be turned off when the current through capacitor 422 is reduced to a predetermined level.

It is to be understood and appreciated that system 400 is but one example for controlling rate of voltage change across a thyristor to meet a predefined noise criteria without employing a filter, and the subject innovation is not so limited. The disclosed subject matter contemplates that, in various other embodiments, the components and circuitry can be modified without materially departing from the subject innovation, and it is intended that all such modifications be included within the scope of the disclosed subject matter.

It is to be further understood and appreciated that the current sink component (e.g., 304, 412) and/or other components can be implemented using various types of transistors, such as a metal-oxide-semiconductor field-effect transistor (MOSFET), an NPN transistor, and/or an insulated-gate bipolar transistor (IGBT), with suitable circuit changes. Further, it is noted that careful component selection is desirable in regard to voltage withstand, current surge ratings, and peak and average power ratings.

Figure 5:
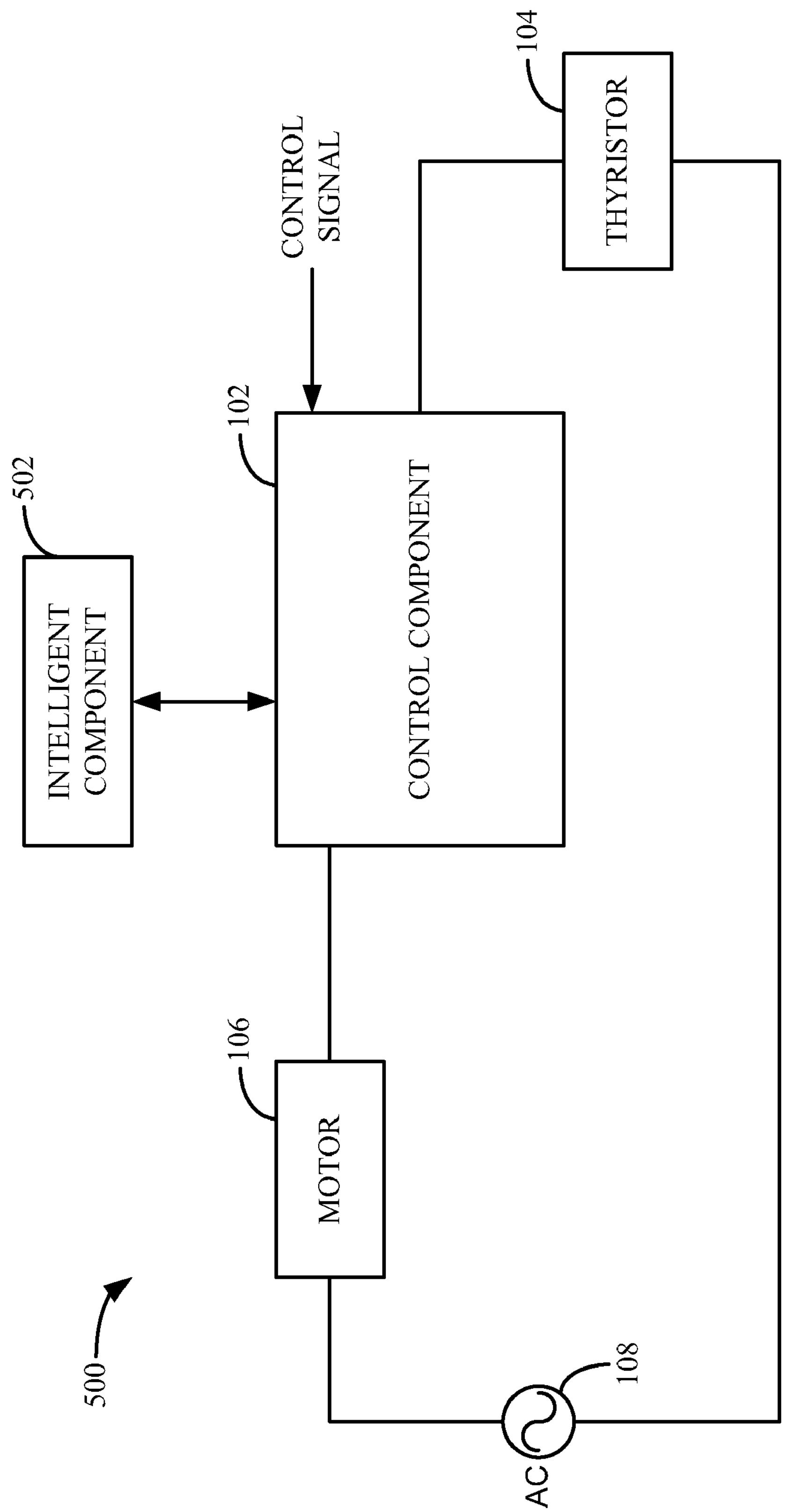
FIG. 5 depicts a block diagram of a system that can employ intelligence to facilitate control of rate of voltage change across a thyristor associated with an inductive load in accordance with an embodiment of the disclosed subject matter.

Referring to FIG. 5, depicted is a block diagram of a system 500 that can employ intelligence to facilitate control of rate of voltage change across a thyristor associated with an inductive load in accordance with an embodiment of the disclosed subject matter. System 500 can include a control component 102 that can facilitate controlling the rate of voltage change across a thyristor 104 (e.g., phase-gated triac) associated with an inductive load, such as a motor 106, when the thyristor 104 is switched from one state (e.g., off state) to another state (e.g. on state), without employing a noise filter (e.g., LC filter). In one aspect, the control component 102 can be electrically connected to the thyristor 104 and a motor 106, which can be an AC induction motor, for example. For instance, in accordance with one embodiment, the thyristor 104 can be a phase-gated triac that can be employed to facilitate controlling the speed of the motor 106. In one aspect, the motor 106 can be electrically connected to a power source 108, which can be an AC power source that can provide a predetermined AC voltage level, which can be virtually any desired AC voltage level at a predetermined frequency. In another aspect, the control component 102 can include a capacitor component 120 that can be utilized, for example, when the thyristor 104 is to be switched from a first state to another state. It is to be appreciated and understood that the control component 102, the thyristor 104, the motor 106, the power source 108, and the capacitor component 120 each can be the same or similar, and/or can contain the same or similar functionality, as respective components, as more fully described herein, for example, with regard to system 100, system 200, system 300, and/or system 400.

The system 500 can further include an intelligent component 502 that can be associated with the control component 102 and/or other components to facilitate analyzing data, such as current and/or historical information, and, based in part on such information, can make an inference(s) and/or a determination(s) regarding, for example, whether the thyristor 104 is to be switched on at a certain point in time, the amount of noise that can be generated by switching an inductively loaded thyristor 104 at a given point in time, the voltage remaining in the capacitor component 120 at a given point in time, etc.

In one aspect, the intelligent component 502 can facilitate tuning the control component 102 so that the control component 102 can facilitate controlling the switching of the inductively loaded thyristor 104 from a first state (e.g., off state) to another state (e.g., one state) based in part on the predefined noise criteria. For instance, based in part on current and/or historical evidence, the intelligent component 502 can infer that the optimal moment in time to switch on the thyristor 104 to meet the predefined noise criteria can be when the capacitor component 120 is discharged to a specified voltage level, even if the voltage level across the gate component (e.g., gate component 302, gate component 402) is not below the predetermined voltage level to trigger the gate component to turn on the thyristor 104; and/or can infer that the optimal moment in time to gate on the thyristor 104 to meet the predefined noise criteria can be when the capacitor component 120 is discharged to a disparate specified voltage level that is lower than the trigger voltage for the gate component to turn on the thyristor 104. The intelligent component 502 can communicate such inference(s) to the control component 102, and the control component 102 can adjust the timing of switching on the thyristor 104 and the rate of voltage change across the thyristor 104 in order to fine tune the switching of the thyristor 104, so that the thyristor 104 can be switched on when the voltage level of the capacitor component 120 reaches the applicable specified voltage level, instead of the thyristor 104 being switched on based on the trigger voltage of the gate component.

It is to be understood that the intelligent component 502 can provide for reasoning about or infer states of the system, environment, and/or user from a set of observations as captured via events and/or data. Inference can be employed to identify a specific context or action, or can generate a probability distribution over states, for example. The inference can be probabilistic—that is, the computation of a probability distribution over states of interest based on a consideration of data and events. Inference can also refer to techniques employed for composing higher-level events from a set of events and/or data. Such inference results in the construction of new events or actions from a set of observed events and/or stored event data (e.g., historical data), whether or not the events are correlated in close temporal proximity, and whether the events and data come from one or several event and data sources. Various classification (explicitly and/or implicitly trained) schemes and/or systems (e.g., support vector machines, neural networks, expert systems, Bayesian belief networks, fuzzy logic, data fusion engines . . . ) can be employed in connection with performing automatic and/or inferred action in connection with the disclosed subject matter.

A classifier is a function that maps an input attribute vector, x=(x1, x2, x3, x4, xn), to a confidence that the input belongs to a class, that is, f(x)=confidence(class). Such classification can employ a probabilistic and/or statistical-based analysis (e.g., factoring into the analysis utilities and costs) to prognose or infer an action that a user desires to be automatically performed. A support vector machine (SVM) is an example of a classifier that can be employed. The SVM operates by finding a hypersurface in the space of possible inputs, which hypersurface attempts to split the triggering criteria from the non-triggering events. Intuitively, this makes the classification correct for testing data that is near, but not identical to training data. Other directed and undirected model classification approaches include, e.g., naive Bayes, Bayesian networks, decision trees, neural networks, fuzzy logic models, and probabilistic classification models providing different patterns of independence can be employed. Classification as used herein also is inclusive of statistical regression that is utilized to develop models of priority.

The aforementioned systems and/or devices have been described with respect to interaction between several components. It should be appreciated that such systems and components can include those components or sub-components specified therein, some of the specified components or sub-components, and/or additional components. Sub-components could also be implemented as components communicatively coupled to other components rather than included within parent components. Further yet, one or more components and/or sub-components may be combined into a single component providing aggregate functionality. The components may also interact with one or more other components not specifically described herein for the sake of brevity, but known by those of skill in the art.

Figure 6:
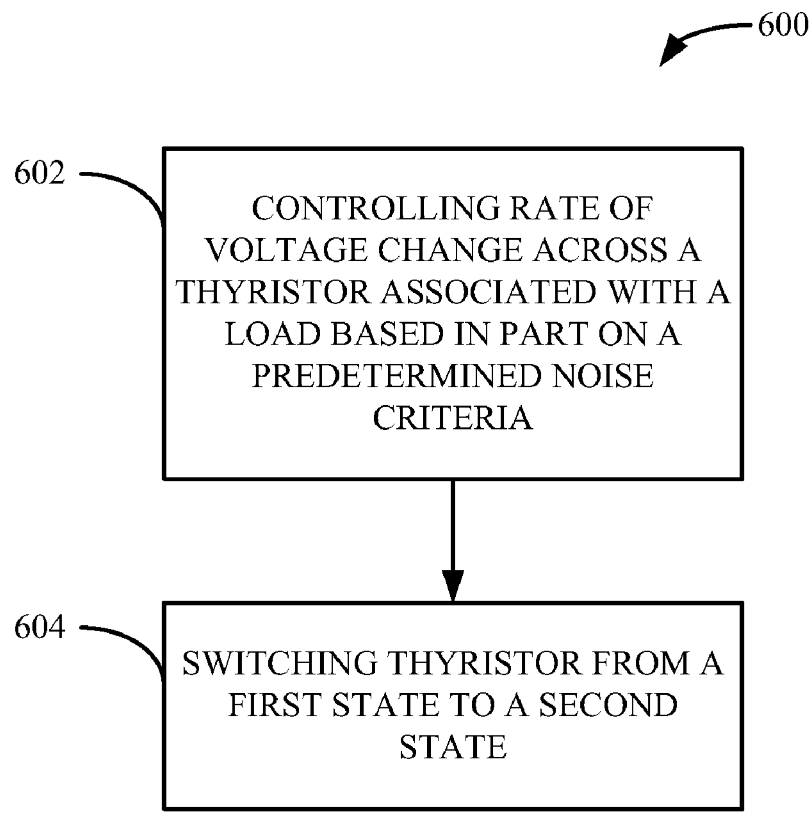
FIG. 6 depicts a methodology that can facilitate controlling rate of voltage change during a state transition of a thyristor associated with an inductive load in accordance with an aspect of the disclosed subject matter.
Figure 7:
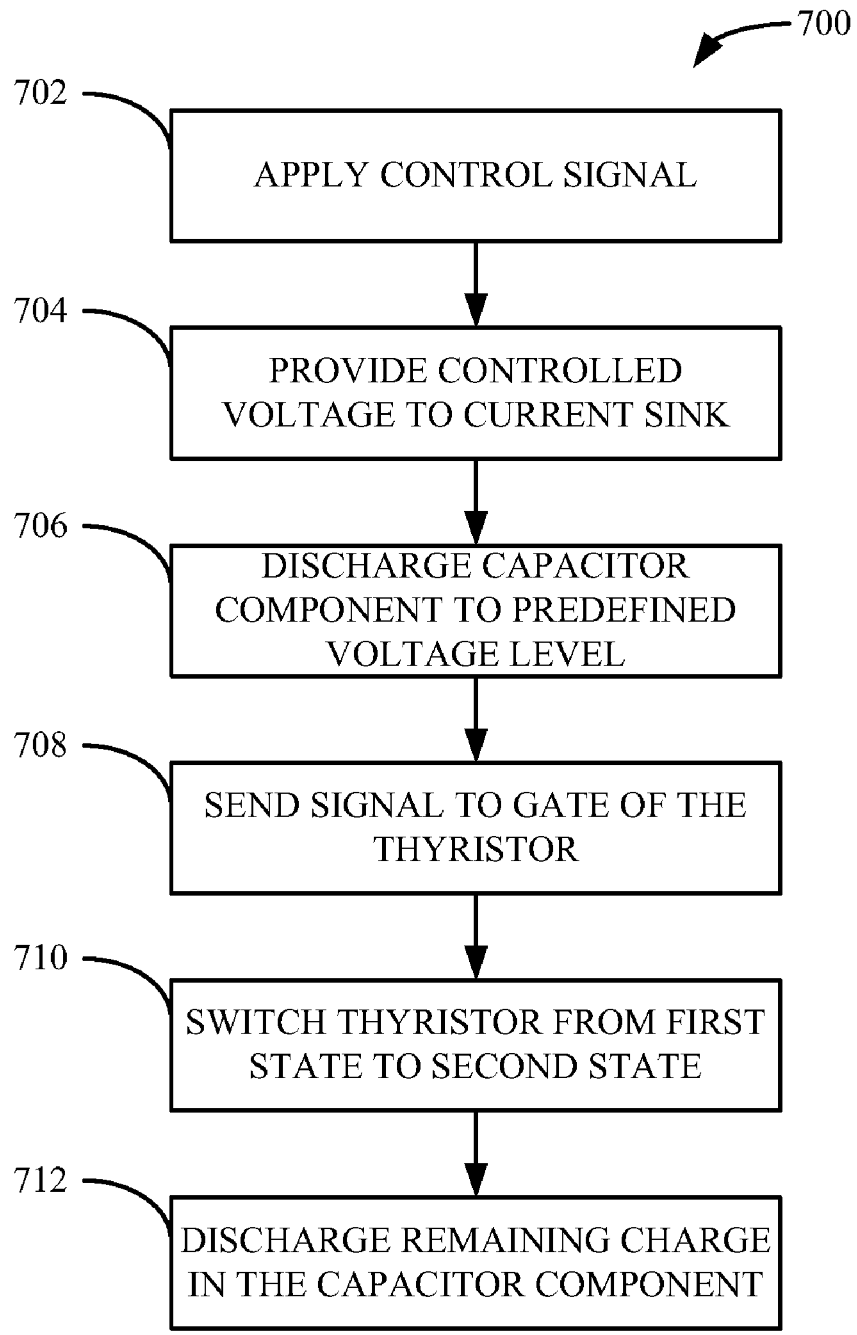
FIG. 7 illustrates a methodology that can facilitate controlling rate of voltage change across a thyristor associated with an inductive load in accordance with an aspect of the disclosed subject matter.
Figure 8:
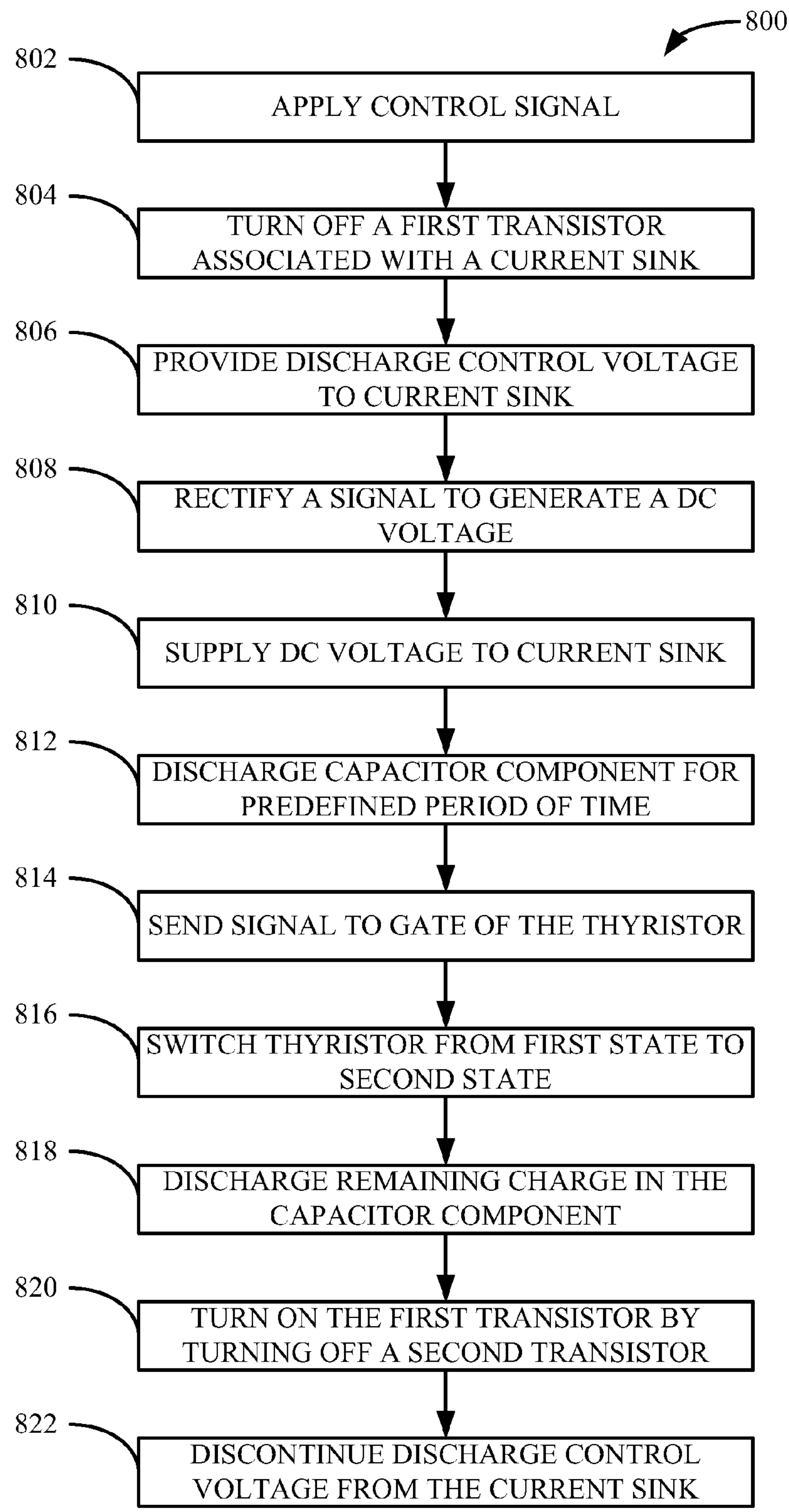
FIG. 8 depicts a methodology that can facilitate controlling rate of voltage change across a thyristor associated with an inductive load in accordance with an embodiment of the disclosed subject matter.

FIGS. 6-8 illustrate methodologies and/or flow diagrams in accordance with the disclosed subject matter. For simplicity of explanation, the methodologies are depicted and described as a series of acts. It is to be understood and appreciated that the subject innovation is not limited by the acts illustrated and/or by the order of acts, for example acts can occur in various orders and/or concurrently, and with other acts not presented and described herein. Furthermore, not all illustrated acts may be required to implement the methodologies in accordance with the disclosed subject matter. In addition, those skilled in the art will understand and appreciate that the methodologies could alternatively be represented as a series of interrelated states via a state diagram or events. Additionally, it should be further appreciated that the methodologies disclosed hereinafter and throughout this specification are capable of being stored on an article of manufacture to facilitate transporting and transferring such methodologies to computers. The term article of manufacture, as used herein, is intended to encompass a computer program accessible from any computer-readable device, carrier, or media.

Referring to FIG. 6, a methodology 600 that can facilitate controlling rate of voltage change during a state transition of a thyristor associated with an inductive load in accordance with an aspect of the disclosed subject matter is illustrated. At 602, the rate of voltage change during a switching of a thyristor (e.g., 104) from a first state (e.g., off state) to a second state (e.g., on state) can be controlled based in part on a predefined noise criteria, where the thyristor can be associated with an inductive load (e.g., motor 106). The predefined noise criteria can relate to, for example, a noise emission limit, such as a limit for noise transmitted to a power line associated with a power source (e.g., 108). In one aspect, a control signal can be received by a control component 102, where the control signal can indicate that the thyristor 104 is to be switched from the first state (e.g. off state) to the second state (e.g., on state). The control component 102 can be utilized to facilitate controlling rate of voltage change across the thyristor 104, which can be electrically connected to an inductive load, when the thyristor is being switched from the first state to the second state, without having to employ a filter (e.g., LC filter). In one aspect, the control signal can be provided to a gate component (e.g. 202, 302, 402) and a discharge control voltage component (e.g., 202, 402) within the control component 102. The gate component can be connected to the gate of the thyristor 104, where, in one embodiment, even after receiving the control signal, the gate component will not trigger to send a signal to the thyristor gate to switch on the thyristor 104 until the voltage level at the gate component is below a predetermined threshold voltage level. In the meantime, the discharge control voltage component, upon receiving the control signal, can generate a predetermined discharge control voltage that can be utilized to facilitate controlling rate of voltage change across an inductive load and/or thyristor 104 when the thyristor 104 is switched. In accordance with another embodiment, based in part on predefined noise criteria, the discharge control voltage component can provide an enable signal to the gate component to trigger the gate component to send a signal to the gate of the thyristor 104 to switch on the thyristor 104.

In another aspect, the control component 102 can employ a capacitor component 120 that can be connected to the inductive load and the switching terminal of the thyristor 104 and can be positioned in parallel with the thyristor 104 in the circuit. The control component 102 can employ a current sink that can comprise a transistor (e.g., 416) connected with a rectifier component 208 (e.g., a diode bridge rectifier), where the current sink can facilitate removing current from the capacitor component 120, and where the magnitude of the current removed can be based in part on the predetermined discharge control voltage, which can be supplied to the current sink by the discharge control voltage component. When the voltage of the capacitor component 120 is discharged to a desired predefined voltage level, which can be a voltage level near 0 volts, the voltage level at the gate component can be at a desired predetermined threshold voltage level, and the gate component can provide a signal to the thyristor gate to switch on the thyristor 104 to facilitate switching the thyristor 104 from the first state to the second state without an undesirably large rate of voltage change in the voltage across the inductive load during switching of the thyristor 104.

At 604, the thyristor can be switched from the first state to the second state. In one aspect, when the control component 102 has discharged the capacitor component 120 to the desired predefined voltage level, which can be a level near 0 volts, the control component 102 (e.g., via the gate component) can send a signal to the gate of the thyristor 104 to switch the thyristor 104 from a first state to the second state, for example, to effect a desired change on the inductive load. The thyristor 104 can discharge the remaining voltage from the capacitor component 120. In one aspect, the switching of the thyristor 104 can be performed to facilitate regulating a parameter(s) (e.g. speed) associated with the inductive load (e.g., motor 106). At this point, methodology 600 can end.

Turning to FIG. 7, depicted is a methodology 700 that can facilitate controlling rate of voltage change across a thyristor associated with an inductive load in accordance with an aspect of the disclosed subject matter. At 702, a control signal can be applied. In one aspect, the control signal can be applied to a control component 102 that can facilitate controlling the switching of a thyristor 104, connected to an inductive load (e.g., motor 106), from a first state (e.g., off state) to a second state (e.g., on state) in order to control (e.g., minimize) switching noise that can be associated with such switching. The single control signal can be transmitted to both a gate component (e.g., 202, 302, 402) and a discharge control voltage component (e.g., 202, 402) within the control component 102. The gate component (e.g., optotriac incorporating zero crossing detection) can be connected to the gate of the thyristor 104 (e.g., phase-gated triac), where the gate component can be utilized to facilitate transitioning the thyristor 104 from one state to another state. The gate component, upon receiving the control signal, initially will not trigger to send a signal to the thyristor gate to switch on the thyristor 104; the gate component can send a signal to the thyristor gate to switch on the thyristor 104 when the voltage level at the gate component is below a predetermined threshold voltage level. In the meantime, the discharge voltage component, upon receiving the control signal, can generate a predetermined discharge control voltage (e.g., a constant or substantially constant discharge control voltage; an optimally "shaped" discharge control voltage to optimize the noise signature) that can be utilized to facilitate controlling rate of voltage change across an inductive load and/or thyristor 104 when the thyristor 104 is switched on.

At 704, a controlled voltage can be provided to a current sink. In accordance with an aspect, the predetermined discharge control voltage can be supplied to a current sink based in part on the received control signal. Upon receiving the control signal, a discharge control voltage component (e.g., discharge control voltage component 204, discharge control voltage component 404) can facilitate providing the predetermined discharge control voltage to the current sink (e.g., current sink component 206, current sink component 304, current sink component 412). In accordance with one embodiment, the current sink can be a voltage-controlled current sink. The current sink can be utilized to discharge the voltage from a capacitor component 120 that can be electrically connected to the load and the switching terminal of the thyristor 104, where the capacitor component 120 can be in parallel with the thyristor 104. Discharging the voltage from the capacitor component 120 can facilitate switching the inductively loaded thyristor 104 such that any noise that manifests as a result of the switching can be sufficiently low so that it can meet the predefined noise criteria.

At 706, the capacitor component 120 can be discharged to a predefined voltage level. In one aspect, the current sink component (e.g., 206, 304, 412) can facilitate discharging the voltage at a controlled rate and removing the current from the capacitor component 120 based in part on the discharge control voltage provided to the current sink component by the discharge control voltage component (e.g., discharge control voltage component 204, discharge control voltage component 404). For example, the discharge control voltage can be a constant or substantially constant voltage that can facilitate discharging the voltage from the capacitor component 120 linearly or substantially linearly until the voltage level of the capacitor component 120 is at the predefined voltage level, which can be a voltage level near 0 volts, for example.

At 708, a signal can be sent to the gate of the thyristor. In accordance with an aspect, the gate component can be connected to the gate of the thyristor 104. In accordance with an embodiment, the gate component can comprise an optotriac that can incorporate zero crossing detection. When the voltage of the capacitor component 120 is the predefined voltage level, the voltage level monitored by the gate component (e.g., at a node associated with the gate component) can be at a level that is below a predetermined threshold voltage level such that the gate component (e.g. zero-crossing type optotriac) can be triggered on, based in part on the received control signal. When the voltage level monitored by the gate component is below the predetermined threshold voltage level, the gate component can conduct a signal to the thyristor gate to facilitate switching the thyristor 104 from the first state to the second state.

At 710, the thyristor can be switched from the first state to the second state. In one aspect, upon receiving the signal at the gate of the thyristor 104 from the gate component, the thyristor 104 can switch from a first state, which can be the off state, to the second state, which can be the on state, for instance.

At 712, the remaining voltage of the capacitor component 120 can be discharged. In one aspect, the thyristor 104, after being switched to an on state, can facilitate discharging any voltage remaining in the capacitor component 120. For instance, when the capacitor component 120 is discharged to the predefined voltage level, the thyristor 104 can be switched on, and, at or near that point in time, the current sink component can be turned off such that the current sink component will discontinue discharging voltage from the capacitor component 120. The thyristor 104 can facilitate discharging any voltage that still remains in the capacitor component 120. During this time, the current associated with the inductive load (e.g., motor 106) can begin to rise, and the thyristor 104 can continue to conduct the current through the inductive load for the remainder of the half-cycle. As methodology 700 can facilitate controlling the switching of the inductively loaded thyristor 104, any noise related to the switching of the thyristor 104 from the first state to the second state can be controlled such that it can meet the predefined noise criteria (e.g., noise emission limit for switching associated with a load connected to a power line in an AC power grid). At this point, methodology 700 can end.

FIG. 8 depicts a methodology 800 that can facilitate controlling rate of voltage change across a thyristor associated with an inductive load in accordance with an embodiment of the disclosed subject matter. At 802, a control signal can be applied. In one aspect, the control signal can be applied to a control component 102 that can facilitate controlling the transitioning (e.g., switching) of an inductively loaded thyristor 104 from a first state (e.g., off state) to a second state (e.g., on state) in order to control (e.g., minimize) switching noise that can be associated with switching the thyristor 104 connected to an inductive load (e.g., motor 106), where the thyristor 104 can be employed to facilitate controlling the motor 106 (e.g. controlling speed of the motor 106). In one aspect, the same control signal can be applied to a gate component (e.g., gate component 202, gate component 302, gate component 402) and a discharge control voltage component (e.g., discharge control voltage component 204, discharge control voltage component 404) within the control component 102, where the gate component can comprise a zero-crossing type optotriac and the discharge control voltage component can include an optotriac, for example. The gate component can be connected to the gate of the thyristor 104 (e.g. phase-gated triac), where the gate component can be utilized to facilitate transitioning the thyristor 104 from one state to another state. The gate component, upon receiving the control signal, initially will not trigger to send a signal to the thyristor gate to switch on the thyristor 104. The gate component can monitor the voltage level at the gate component and can send a signal to the thyristor gate to switch on the thyristor 104 when the voltage level at the gate component is below a predetermined threshold voltage level. The discharge voltage component, upon receiving the control signal, can generate a predetermined discharge control voltage (e.g. a constant or substantially constant discharge control voltage) that can be utilized to facilitate controlling rate of voltage change across an inductive load and/or thyristor 104 when the thyristor 104 is switched on.

At 804, a first transistor associated with a current sink can be turned off based in part by turning on a second transistor.

When turned off, the first transistor can facilitate engaging (e.g., turning on) the voltage-controlled current sink to facilitate discharging voltage and removing current from the capacitor component 120. In one embodiment, the discharge control voltage component (e.g., 404) can include an optotriac 406, a first transistor (e.g., transistor 408) and a second transistor (e.g., transistor 410), where the gate of the first transistor can be electrically connected to a second transistor. After the discharge control voltage component receives the control signal, the optotriac 406 can provide the predetermined discharge control voltage. Based in part on the predetermined discharge control voltage, the second transistor can facilitate turning off the first transistor when the current through the base emitter junction of the second transistor exceeds a predetermined current threshold level, which can occur when the voltage level at the junction of resistor 420 and capacitor 422 decreases to a desired voltage level. Such desired voltage level can be reached quickly due in part to the optotriac 406 being turned on after receiving the control signal. Turning off the first transistor can facilitate providing the discharge control voltage to the current sink to facilitate operation of the current sink.

At 806, a discharge control voltage can be provided to a current sink. In accordance with an aspect, the predetermined discharge control voltage can be supplied to a current sink based in part on the received control signal. Upon receiving the control signal, the optotriac 406 in the discharge control voltage component can facilitate providing the predetermined discharge control voltage to the current sink (e.g., current sink component 206, current sink component 304, current sink component 412), which can comprise a transistor 416, and the current sink can be utilized to discharge the voltage from the capacitor component 120. Discharging the voltage from the capacitor component 120 can facilitate switching the inductively loaded thyristor 104 from one state to another such that any switching noise generated as a result thereof can meet the predefined noise criteria.

At 808, a signal can be rectified to generate a DC voltage. In one embodiment, a rectifier component (e.g. rectifier component 208) can be a diode bridge rectifier that can receive an AC signal from the capacitor component 120. The rectifier component can produce a DC voltage based in part on the received signal.

At 810, the DC voltage can be supplied to the current sink. In accordance with an embodiment, the rectifier component 208 can supply the DC voltage to the transistor 416 in the current sink component to facilitate discharging voltage from the capacitor component 120.

At 812, the capacitor component 120 can be discharged for a predefined period of time. In one aspect, the current sink component, employing the transistor 416, can facilitate discharging the voltage at a controlled rate (e.g., linear or substantially linear voltage discharge) and removing the current from the capacitor component 120 based in part on the predetermined discharge control voltage (e.g., constant or substantially constant discharge control voltage) provided to the current sink component by the discharge control voltage component (e.g., discharge control voltage component 404). The discharge control voltage, which can be a constant or substantially constant voltage, can facilitate discharging the voltage from the capacitor component 120 linearly or substantially linearly. The voltage in the capacitor component 120 can be discharged to a desired predefined voltage level, which can be a voltage level that is close to 0 volts (e.g. 4 volts or less).

At 814, a signal can be provided to the gate of the thyristor. In accordance with an aspect, the thyristor 104 can be switched on by the gate component (e.g., gate component 202, gate component 302, gate component 402) when the voltage level of the capacitor component 120 has been discharged to the predefined voltage level. The gate of the thyristor 104 can be electrically connected to the gate component, which can comprise a zero-crossing type optotriac, for instance. When the voltage of the capacitor component 120 is at a desired predefined voltage level (e.g. near 0 volts), the voltage level monitored by the gate component can be at a level that is below a predetermined threshold voltage level such that the gate component can be triggered on, based in part on the received control signal, and the gate component can conduct to send a signal to the gate of the thyristor 104 to facilitate switching the thyristor 104 from the first state to the second state.

At 816, the thyristor can be switched from the first state to the second state. In one aspect, upon receiving the signal at the gate of the thyristor 104 from the gate component, the thyristor 104 can switch from a first state (e.g., off state) to the second state (e.g., on state).

At 818, the remaining voltage of the capacitor component 120 can be discharged. In one aspect, the thyristor 104, after being switch to an on state, can facilitate discharging any voltage that remains in the capacitor component 120 at the time the thyristor 104 is switched on. For instance, when the capacitor component 120 is discharged to the predefined voltage level, the thyristor 104 can be switched on, and, at or near that point in time, the current sink component can be turned off, and the thyristor 104 can facilitate discharging any voltage that remains in the capacitor component 120. During this time, the current associated with the inductive load (e.g., motor 106) can begin to rise, and the thyristor 104 can continue to conduct the current through the inductive load for the remainder of the half-cycle.

At 820, the first transistor can be turned on. In accordance with an embodiment, the second transistor (e.g., transistor 410) can be turned off, which can result in the first transistor (e.g. transistor 408) being turned on, which can facilitate discontinuing the discharge control voltage at the current sink component and turning off the current sink component. At 822, the discharge control voltage can be removed from the current sink. In one embodiment, turning on the first transistor can facilitate removing the discharge control voltage from the current sink component. For instance, to facilitate turning off the discharge control voltage component 404 in order to return the discharge control voltage to near 0 volts, which can be desirable if the thyristor 104 fails to switch on, the first transistor can be turned on as the second transistor is turned off, where the second transistor can be turned off when the current level through capacitor 422 can be reduced to a predetermined level. Thus, even if the gate component fails to switch on the thyristor 104, the second transistor can still turn off to facilitate turning on the first transistor in order to discontinue (e.g., remove) the discharge control voltage from the current sink, which can prevent load current from continuing to flow through the current sink if the thyristor 104 fails to switch on. At this point, methodology 800 can end.

The subject innovation can facilitate controlling the rate of voltage change across an inductively loaded thyristor during switching of the thyristor from one state (e.g., off state) to another state (e.g., on state) to facilitate controlling and limiting noise emissions associated with such switching, without employing a filter, such as an LC filter. As a result, the subject innovation can facilitate decreasing the cost, size, weight, and heat loss of products employing the methodologies described herein, as compared to conventional methodologies, techniques, systems, etc.

It is to be understood and appreciated that the computer-implemented programs and software can be implemented within a standard computer architecture. While some aspects of the disclosure have been described above in the general context of computer-executable instructions that can be run on one or more computers, those skilled in the art will recognize that the technology also can be implemented in combination with other program modules and/or as a combination of hardware and software.

Generally, program modules include routines, programs, components, data structures, etc., that perform particular tasks or implement particular abstract data types. Moreover, those skilled in the art will appreciate that the inventive methods can be practiced with other computer system configurations, including single-processor or multiprocessor computer systems, minicomputers, mainframe computers, as well as personal computers, hand-held computing devices (e.g., PDA), microprocessor-based or programmable consumer electronics, and the like, each of which can be operatively coupled to one or more associated devices.

The illustrated aspects of the disclosure can also be practiced in distributed computing environments where certain tasks are performed by remote processing devices that are linked through a communications network. In a distributed computing environment, program modules can be located in both local and remote memory storage devices.

As utilized herein, terms "component," "system," and the like, can refer to a computer-related entity, either hardware, software (e.g., in execution), and/or firmware. For example, a component can be a process running on a processor, a processor, an object, an executable, a program, and/or a computer. By way of illustration, both an application running on a server and the server can be a component. One or more components can reside within a process and a component can be localized on one computer and/or distributed between two or more computers.

Furthermore, the disclosed subject matter can be implemented as a method, apparatus, or article of manufacture using standard programming and/or engineering techniques to produce software, firmware, hardware, or any combination thereof to control a computer to implement the disclosed subject matter. The term "article of manufacture" as used herein is intended to encompass a computer program accessible from any computer-readable device, carrier, or media. For example, computer readable media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ). Additionally it should be appreciated that a carrier wave can be employed to carry computer-readable electronic data such as those used in transmitting and receiving electronic mail or in accessing a network such as the Internet or a local area network (LAN). Of course, those skilled in the art will recognize many modifications may be made to this configuration without departing from the scope or spirit of the disclosed subject matter.

What has been described above includes examples of aspects of the disclosed subject matter. It is, of course, not possible to describe every conceivable combination of components or methodologies for purposes of describing the disclosed subject matter, but one of ordinary skill in the art may recognize that many further combinations and permutations of the disclosed subject matter are possible. Accordingly, the disclosed subject matter is intended to embrace all such alterations, modifications and variations that fall within the spirit and scope of the appended claims. Furthermore, to the extent that the terms "includes," "has," or "having," or variations thereof, are used in either the detailed description or the claims, such terms are intended to be inclusive in a manner similar to the term "comprising" as "comprising" is interpreted when employed as a transitional word in a claim.

What is claimed is:

1. A system that facilitates control of rate of voltage change, comprising:

a thyristor that changes from a first state to at least one other state to regulate an inductive load;

a control component that employs a voltage-controlled current sink to facilitate control of change of the thyristor from the first state to the at least one other state as a function of predefined noise criteria;

a discharge control voltage component that supplies a predetermined discharge control voltage to the current sink to facilitate discharge of voltage from a capacitor component; and a rectifier component that receives a signal associated with alternating current and produces a signal associated with direct current as an output, the output is provided to the current sink to facilitate discharge of voltage from the capacitor component.

2. The system of claim 1, wherein the predefined noise criteria is based in part on a limit as to amount of noise that is emitted to a power line in a power grid by a load connected to the power line, a product associated with the load, or a function being performed with respect to the load.

3. The system of claim 1, wherein the rectifier component comprises a diode rectifier bridge.

4. The system of claim 1, wherein the current sink discharges voltage from the capacitor component to a predefined voltage level or for a predefined period of time.

5. A device comprising the system of claim 1.

6. A system that facilitates control of rate of voltage change, comprising:

a thyristor that changes from a first state to at least one other state to regulate an inductive load; and a control component that employs a voltage-controlled current sink to facilitate control of change of the thyristor from the first state to the at least one other state as a function of predefined noise criteria;

a discharge control voltage component that supplies a predetermined discharge control voltage to the current sink to facilitate discharge of voltage from a capacitor component;

wherein the discharge control voltage component comprises an optotriac that facilitates supply of the constant discharge control voltage based in part on a received control signal.

7. The system of claim 6, wherein the predefined noise criteria is based in part on a limit as to amount of noise that is emitted to a power line in a power grid by a load connected to the power line, a product associated with the load, or a function being performed with respect to the load.

8. A system that facilitates control of rate of voltage change, comprising:

a thyristor that changes from a first state to at least one other state to regulate an inductive load;

a control component that employs a voltage-controlled current sink to facilitate control of change of the thyristor from the first state to the at least one other state as a function of predefined noise criteria;

a discharge control voltage component that supplies a predetermined discharge control voltage to the current sink to facilitate discharge of voltage from a capacitor component; and a gate component that is electrically connected to a gate of the thyristor and is enabled by the discharge control voltage component to switch the thyristor from the first state to the at least one other state based in part on predefined noise criteria.

9. The system of claim 8, wherein the predefined noise criteria is based in part on a limit as to amount of noise that is emitted to a power line in a power grid by a load connected to the power line, a product associated with the load, or a function being performed with respect to the load.

10. A system that facilitates control of rate of voltage change, comprising:

a thyristor that changes from a first state to at least one other state to regulate an inductive load;

a control component that employs a voltage-controlled current sink to facilitate control of change of the thyristor from the first state to the at least one other state as a function of predefined noise criteria;

a discharge control voltage component that supplies a predetermined discharge control voltage to the current sink to facilitate discharge of voltage from a capacitor component; and a gate component that is electrically connected to a gate of the thyristor and monitors voltage level associated with the thyristor, wherein such voltage level is based in part on voltage level of the capacitor component, and switches the thyristor from the first state to the at least one other state when the voltage level associated with the thyristor is at a predefined voltage level to facilitate meeting the predefined noise criteria.

11. The system of claim 10, the gate component comprising an optotriac that incorporates zero crossing detection.

12. The system of claim 10, wherein the predefined noise criteria is based in part on a limit as to amount of noise that is emitted to a power line in a power grid by a load connected to the power line, a product associated with the load, or a function being performed with respect to the load.

13. A system that facilitates control of rate of voltage change, comprising:

a thyristor that changes from a first state to at least one other state to regulate an inductive load;

a control component that employs a voltage-controlled current sink to facilitate control of change of the thyristor from the first state to the at least one other state as a function of predefined noise criteria;

a discharge control voltage component that supplies a predetermined discharge control voltage to the current sink to facilitate discharge of voltage from a capacitor component wherein the discharge control voltage component further comprises:

a first transistor associated with the current sink;

a second transistor electrically connected to the first transistor, the second transistor turns off the first transistor to facilitate the supply of the substantially constant voltage to the current sink; and a capacitor associated with the second transistor, the second transistor is turned off when the current level through the capacitor is exhausted, and the first transistor is turned on based in part on the second transistor being turned off, wherein the first transistor is turned on to discontinue the supply of the substantially constant control voltage to the current sink to facilitate prevention of a load current through the current sink.

14. The system of claim 13, wherein the predefined noise criteria is based in part on a limit as to amount of noise that is emitted to a power line in a power grid by a load connected to the power line, a product associated with the load, or a function being performed with respect to the load.

15. A method that facilitates controlling the rate of change of voltage across a thyristor associated with an inductive load, comprising:

controlling rate of voltage change when switching an inductively loaded thyristor from a first state to a second state based in part on a predefined noise criteria;

switching the inductively loaded thyristor from the first state to the second state;

applying a control signal to drive a controlled discharge of voltage from a capacitor to a predefined voltage level to facilitate switching the inductively loaded thyristor from the first state to the second state; and discharging voltage remaining in the capacitor after the inductively loaded thyristor is switched from the first state to the second state.

16. A method that facilitates controlling the rate of change of voltage across a thyristor associated with an inductive load, comprising:

controlling rate of voltage change when switching an inductively loaded thyristor from a first state to a second state based in part on a predefined noise criteria;

switching the inductively loaded thyristor from the first state to the second state;

applying a control signal to facilitate supplying a controlled voltage to a current sink;

turning off a first transistor associated with the current sink based in part by turning on a second transistor associated with the first transistor;

supplying a controlled voltage to the current sink based in part on turning off the first transistor;

rectifying a signal associated with alternating current to generate a voltage level associated with direct current;

supplying the voltage level associated with direct current to the current sink; and discharging a capacitor to a predefined voltage level based in part on the controlled voltage.

17. The method of claim 16, further comprising:

switching the inductively loaded thyristor from the first state to the second state when the voltage level associated with the inductively loaded thyristor is below a predetermined voltage level, wherein the voltage level associated with the inductively loaded thyristor is based in part on the voltage level associated with the capacitor; and discharging voltage remaining in the capacitor.

18. The method of claim 16, further comprising:

turning on the first transistor to facilitate removing the controlled voltage from the current sink regardless of whether the inductively loaded thyristor is switched on to facilitate preventing a load current from flowing through the current sink.

19. The method of claim 16, wherein the predefined noise criteria is based in part on a limit on an amount of noise that a load emits to a power line in a power grid, a product associated with the load, or a function being performed with respect to a load.

20. A system that facilitates controlling rate of voltage change of a thyristor connected to a load, further comprising:

means for controlling rate of voltage change when switching a thyristor from a first state to another state based in part on a predefined noise criteria, the thyristor is connected to an inductive load; and means for switching the thyristor from the first state to the other state; means for discharging voltage from a capacitor to a predefined voltage level;

means for supplying a constant discharge control voltage to the means for discharging voltage from the capacitor to facilitate linearly discharging voltage from the capacitor;

means for producing a voltage associated with direct current based in part on a received signal associated with alternating current, the means for producing a voltage associated with direct current is provided to the means for discharging voltage from a capacitor; and means for switching on the thyristor when the voltage level associated with the means for switching on the thyristor is at a predetermined voltage level, the voltage level associated with the means for switching on the thyristor is a function of the voltage level of the capacitor.

* * * * *